US011824536B2

United States Patent
Yuenyongsgool et al.

(10) Patent No.: US 11,824,536 B2
(45) Date of Patent: Nov. 21, 2023

(54) AUTOMATIC PROTECTION AGAINST RUNT PULSES

(71) Applicant: Microchip Technology Incorporated, Chandler, AZ (US)

(72) Inventors: Yong Yuenyongsgool, Gilbert, AZ (US); Stephen Bowling, Chandler, AZ (US); Pedro Ovalle, Chandler, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 18/112,812

(22) Filed: Feb. 22, 2023

(65) Prior Publication Data

US 2023/0308084 A1 Sep. 28, 2023

Related U.S. Application Data

(63) Continuation of application No. 17/557,204, filed on Dec. 21, 2021, now Pat. No. 11,621,702.

(60) Provisional application No. 63/162,993, filed on Mar. 18, 2021.

(51) Int. Cl.
*H03K 3/017* (2006.01)
*G06F 1/06* (2006.01)
*H03K 21/02* (2006.01)

(52) U.S. Cl.
CPC ............... *H03K 3/017* (2013.01); *G06F 1/06* (2013.01); *H03K 21/02* (2013.01)

(58) Field of Classification Search
CPC ...................................... H03K 3/017
USPC .......................................................... 327/175
See application file for complete search history.

(56) References Cited

U.S. PATENT DOCUMENTS

| 7,420,398 B1 | 9/2008 | Tung et al. .................. 327/174 |
| 9,838,000 B1 | 12/2017 | Arbetter |
| 2004/0232978 A1* | 11/2004 | Easson .................. H03F 3/2173 330/10 |
| 2006/0061407 A1 | 3/2006 | Biswurm et al. ............. 327/407 |

OTHER PUBLICATIONS

International Search Report and Written Opinion, Application No. PCT/US2022/011011, 12 pages, dated Apr. 4, 2022.

* cited by examiner

*Primary Examiner* — Tomi Skibinski
(74) *Attorney, Agent, or Firm* — SLAYDEN GRUBERT BEARD PLLC

(57) ABSTRACT

An apparatus includes an adjustment circuit configured to receive a pulsed-width modulation (PWM) input, generate an adjusted PWM signal based upon the PWM input, and determine that a first pulse of the PWM input is shorter than a runt signal limit. The adjustment circuit is further configured to, in the adjusted PWM signal, extend the first pulse of the PWM input based on the determination that the PWM input is shorter than the runt signal limit, and output the adjusted PWM signal to an electronic device.

9 Claims, 9 Drawing Sheets

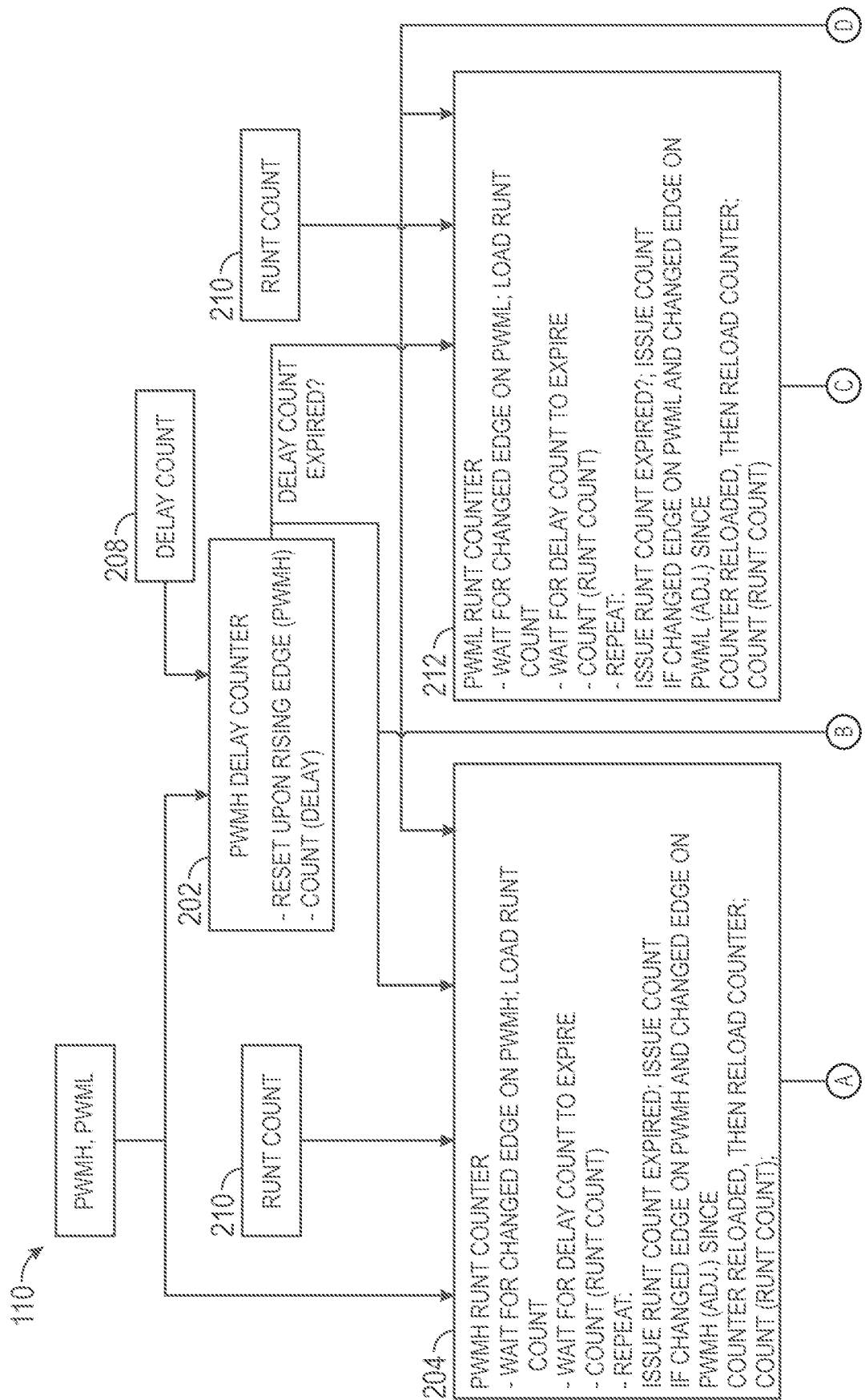

AUTOMATIC PROTECTION AGAINST RUNT PULSES

PRIORITY

The present application claims priority to U.S. Provisional Patent Application No. 63/162,993 filed Mar. 18, 2021, the contents of which are hereby incorporated in their entirety.

FIELD OF THE INVENTION

The present disclosure relates to pulsed-width modulation (PWM) signal generation and, more particularly, to automatic protection against runt pulses generated as part of PWM signals.

BACKGROUND

PWM signal generation may cause the generation of runt pulses. A runt pulse may include a pulse whose duration at a high level or a low level that is too short to be accurately or correctly detected as a logical high or logical low value.

In power electronics, signals with small duty cycles can yield runt pulses. This may especially occur after additional pulse shaping efforts, such as dead-time compensation, have been applied. Runt pulses can damage application circuits as they put the power semiconductor devices in a linear region of operation. As these devices become faster and faster, the range difference between runt pulses and valid pulses decreases. Existing techniques of run pulse prevention via software may become ineffective, as the range difference reaches the range of between 2-3 ns.

Inventors of examples of the present disclosure have discovered implementations of automatic protection against runt pulses that address one of more of these issues.

DETAILED DESCRIPTION

Figure 1:
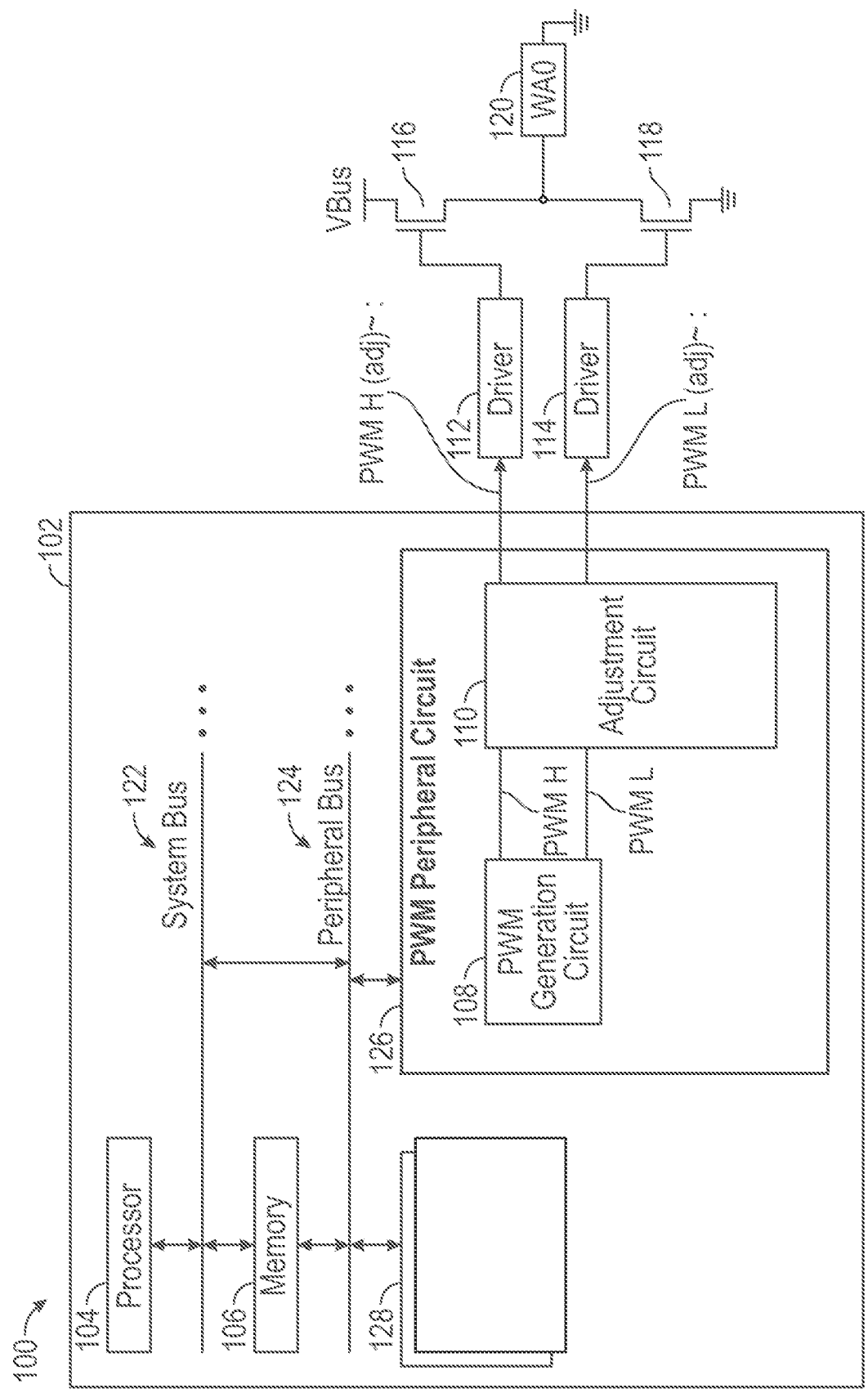
FIG. 1 is an illustration of an example system 100 for automatic protection against runt pulses, according to examples of the present disclosure.

FIG. 1 is an illustration of an example system 100 for automatic protection against runt pulses, according to examples of the present disclosure. System 100 may include or be embodied by a microcontroller, system on a chip, field programmable gate array, application specific integrated circuit, power controller, or any other suitable electronic device or combination of electronic devices.

For example, system 100 may include a microcontroller 102. Microcontroller 102 may be configured to regulate power, voltage, or current for a load 120. Although showed as external to microcontroller 102, load 120 may be within or outside of microcontroller 102. Power, voltage, or current to be provided to load 120 may be regulated through any suitable circuit that applies PWM signals. Such a circuit may be a switching circuit. For example, power to load 120 may be provided from a voltage source, Vbus, as switched through any suitable electronic devices. Vbus may be switched to load 120 through a first electronic device 116 and a second electronic device 118. Electronic devices 116, 118 may include transistors or other switches connected in series, wherein the source of electronic device 116 is connected to Vbus, the drain of electronic device 116 is connected to the source of electronic device 118, and the drain of electronic device 118 is connected to ground. Load 120 may be powered from a midpoint between the drain of electronic device 116 and the source of electronic device 118. In other examples, a single electronic device might be used to connect Vbus to load 120.

The gates of electronic devices 116, 118 may be driven by signals from microcontroller 102. Specifically, a PWMH (adj.) signal may be used to drive the gate of electronic device 116, and a PWML (adj.) signal may be used to drive the gate of electronic device 118. Thus, electronic devices 116, 118 may be switched on and off by digital pulses of PWMH (adj.) and PWML (adj.) signals. PWMH (adj.) and PWML (adj.) signals may be substantially the complement of each other, except for transition times, inaccuracies between the circuitry generated the respective signals, and intentionally created deadtime wherein both PWMH (adj.) and PWML (adj.) signals are zero or logic low. PWMH (adj.) and PWML (adj.) signals may be passed through any suitable signal conditioning for appropriately matching the requirements of gate signals for electronic devices 116, 118. For example, PWMH (adj.) and PWML (adj.) signals may be passed through driver circuits 112, 114 before being applied respectively to the gates of electronic devices 116, 118.

When PWMH (adj.) signals are high, electronic device 116 may be switched ON, allowing VBus to be routed to load 120. At the same time, PWML (adj.) signals may be low, wherein electronic device 118 is switched OFF, further facilitating Vbus to be routed to load 120, rather than to ground through electronic device 118. When PWMH (adj.) signals are low, electronic device 116 may be switched OFF, disconnecting VBus from load 120. At the same time, PWML (adj.) signals may be high, wherein electronic device 118 is switched ON, connecting load 120 to ground. The frequency and duty cycles of PWMH (adj.) and PWML (adj.) may cause Vbus and ground voltages to be alternately applied to load 120 such that the effective result is a regulated voltage. Microcontroller 102 may receive input (not shown) indicating the voltage or current applied to load 120 in a feedback manner, so that, if necessary, the frequency or duty cycles of PWMH (adj.) and PWML (adj.) signals may be changed.

Microcontroller 102 may be implemented in any suitable manner. Microcontroller 102 may include a processor 104 communicatively coupled to a memory 106. Memory 106 may include instructions that, when loaded and executed by processor 104, cause processor 104 to perform various functionality. Moreover, memory 106 may include any suitable number and kind of registers that may be written to or read by various portions of microcontroller 102 to implement settings or commands. Processor 104, memory 106, and other elements of microcontroller 102 may be communicatively coupled through use of, for example, a system bus 122.

Microcontroller 102 may include any suitable number and kind of elements configured to perform tasks on behalf of or at the request of other elements of microcontroller 102. Such elements may be implemented as, for example, circuits, IPs, or peripherals. Such elements may be referenced as peripherals in that they are located outside of processing cores of processor 104. Such elements may perform tasks on behalf of, for example, processor 104, wherein processor 104 sets operational parameters or instructions for the element, and then operations are performed asynchronously and in hardware without further intervention or instructions processed by processor 104. For example, microcontroller 102 may include a PWM peripheral circuit 126 and one or more other peripherals 128. Such other peripherals 128 may include, for example, a UART peripheral, I²C peripheral, timers, configurable logic cells, trigger generators, digital to analog converters, comparators, analog to digital converters, or touch peripherals. PWM peripheral circuit 126 and peripherals 128 may be communicatively coupled to each other and to other elements of microcontroller 102 through, for example, a peripheral bus 124 communicatively coupled to system bus 122.

PWM peripheral circuit 126 may be configured to cause a constant voltage to be provided to load 120. PWM peripheral circuit 126 may be configured to, for example, provide control signals to electronic devices 116, 118. Providing the constant voltage may be made asynchronously with respect to processor 104 and without further instructions from processor 104. PWM peripheral circuit 126 may be configured to read register values from memory 106, receive control signals, or perform any other suitable function to determine operational parameters for causing the constant voltage to be provided to load 120. The operational parameters may include, for example, an indication of a voltage or current that is to be generated for load 120. PWM peripheral circuit 126 may receive feedback signals (not shown) from the power, voltage, or current provided to load 120 in order to determine whether any adjustments, up or down, in the required voltage or current are to be made. PWM peripheral circuit 126 may be configured to determine, for the designated voltage or current to be applied to load 120 and appropriate PWM signals to be generated and provided to electronic devices 116, 118 in order to provide the designated voltage.

PWM peripheral circuit 126 may be implemented in any suitable manner. PWM peripheral circuit 126 may be implemented by analog circuitry, digital circuitry, digital logic, instructions for execution by a processor, application-specific integrated circuit (ASIC), field-programmable gate array (FPGA), or any suitable combination thereof. PWM peripheral circuit 126 may include a PWM generation circuit 108 and an adjustment circuit 110. PWM generation circuit 108 and adjustment circuit 110 may be implemented in any suitable manner, such as by analog circuitry, digital circuitry, digital logic, ASIC, FPGA, instructions for execution by a processor, or any suitable combination thereof. PWM peripheral circuit 126 may be configured to generate PWMH and PWML signals based upon desired voltage or current to be applied to load 120. Adjustment circuit 110 may be configured to adjust the PWMH and PWML signals to yield PWMH (adj.) and PWML (adj.) signals. Adjustment circuit 110 may be configured to receive a clock signal (not shown) from any suitable portion of system 100. In one example, adjustment circuit 110 may be configured to adjust the PWMH and PWML signals so that the rise or fall of pulses on PWMH (adj.) and PWML (adj.) signals are offset or delayed from the rise or fall of pulses of PWMH and PWML signals. The offset or delay of PWMH (adj.) or PWML (adj.) may be in an amount that is smaller than a cycle of the received clock.

In one example, adjustment circuit 110 may be configured to adjust the PWMH and PWML signals by stretching such signals so that the rise or fall of pulses on PWMH (adj.) and PWML (adj.) signals are not runt signals. In another example, adjustment circuit 110 may be configured to adjust the PWMH and PWML signals by gobbling pulses of such signals so that such signals are suppressed in the resultant PWMH (adj.) and PWML (adj.) signals. Gobbling of pulses may include eliminating entire pulses from the resultant signal. In yet another example, adjustment circuit 110 may be configured to adjust the PWMH and PWML signals by stretching such signals so that the rise or fall of pulses on PWMH (adj.) and PWML (adj.) signals account for dead time of electronic devices 116, 118.

To perform adjustment of the PWMH and PWML signals, adjustment circuit 110 may in turn include, for example, counters, output circuits, gobble circuits, or any other suitable components. These are shown in more detail in, for example, FIGS. 2-3, 5, 7. Adjustment circuit 110 may include sets of counters and output circuits for each of PWMH and PWML. The counters, gobble circuits, output circuits, and other components may be implemented in any suitable manner and may be configured to store or process any suitable information to perform the configured operation of adjustment circuit 110. For example, these may be implemented by Adjustment circuit 110 may include or be communicatively coupled to any suitable source of information. For example, adjustment circuit 110 may receive control signals from processor 104. In another example, adjustment circuit 110 may read registers in memory 106 or within any other suitable portion of system 100.

Figure 2:
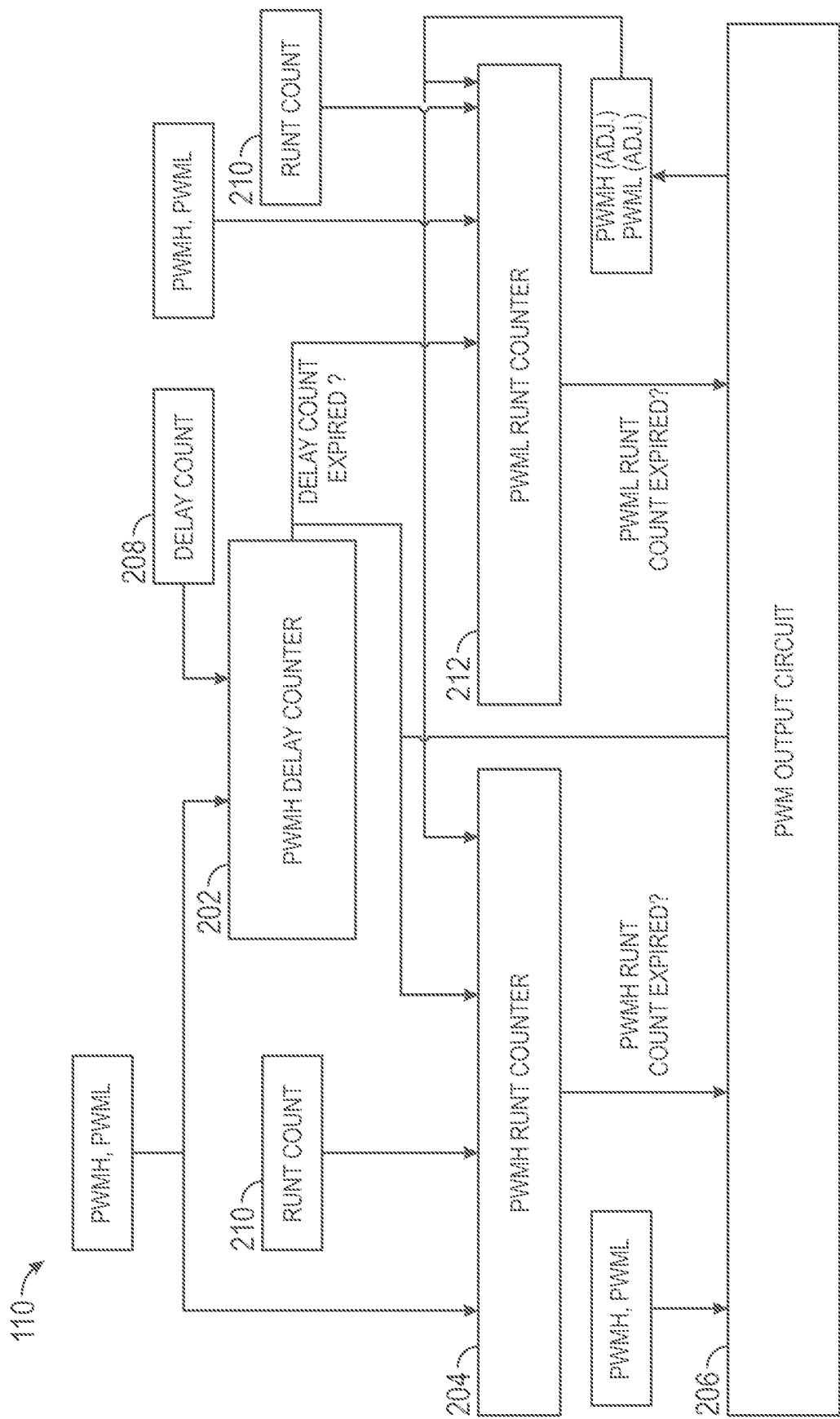
FIGS. 2 and 3 are more detailed illustrations of portions of adjustment circuit 110, according to examples of the present disclosure.
Figure 3:
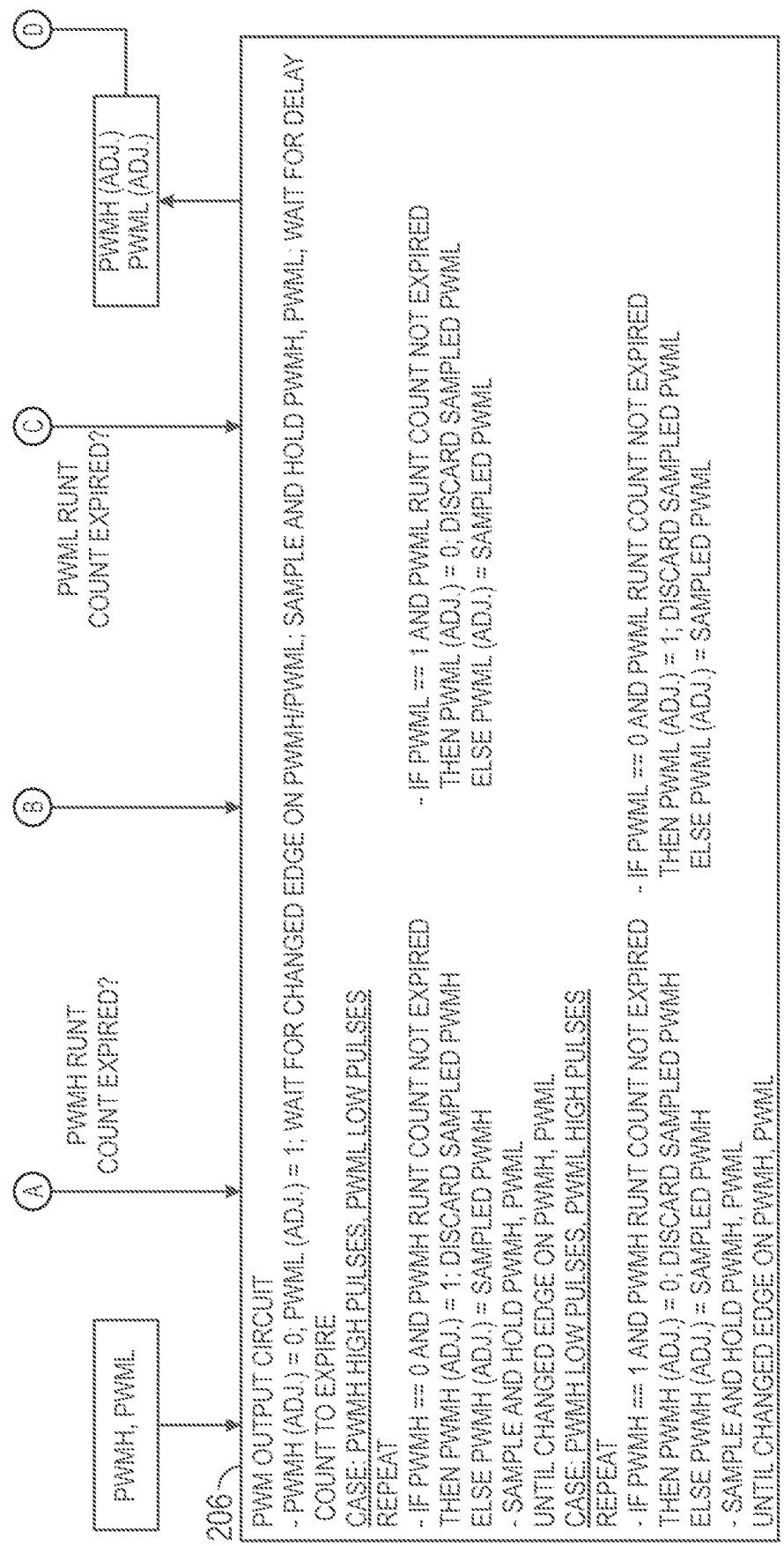

FIGS. 2 and 3 are more detailed illustrations of portions of adjustment circuit 110, according to examples of the present disclosure. FIG. 2 may illustrate portions of adjustment circuit 110 for adjusting the received PWMH signals to yield PWMH (adj.) signals and for adjusting the received PWML signals to yield PWML (adj.) signals.

Adjustment circuit 110 may receive as input the PWMH and PWML signals. Moreover, adjustment circuit 110 may receive as input or include indicators of a runt count 210. Runt count 210 may be implemented in any suitable manner, such as by a register. Runt count 210 may include a value to define or designate a minimum number of clock cycles that a pulse must include, and if the pulse includes fewer clock cycles, it is a runt pulse.

Adjustment circuit 110 may include a PWM delay counter 202. PWM delay counter 202 may be configured to delay or cause the delay of processing of PWMH and PWML to yield output of PWMH (adj.) and PWML (adj.), or to simply delay PWMH (adj.) and PWML (adj.) themselves. This delay may be due to, for example, latency of operation of adjustment circuit 110, a delay set by users, software, or settings of system 100, or any other purpose or phenomena. Moreover, this delay may be cumulative of two or more such sources of delay. Such a delay may be applied equally to both rising and falling transitions of PWMH and PWML. Moreover, additional adjustments, such as fine edge enhancement that define, a given cycle, how many subdivisions of the clock cycle should be used to offset output of PWMH (adj.) or PWML (adj.) signals relative to PWMH or PWML signals, may be performed by adjustment circuit 110. Adjustment circuit 110 may receive as input or include indicators of a delay count 208. Delay count 208 may be implemented in any suitable manner, such as by a register. In the examples of the present disclosure, and for the sake of the simplicity of illustration, delay count 208 may be one. PWM delay counter 202 may be implemented in any suitable manner, such as with analog circuitry, digital circuitry, instructions for execution by a processor, ASIC, FPGA, or any suitable combination thereof.

In one example, adjustment circuit 110 may include a PWMH runt counter 204. PWMH runt counter 204 may be implemented in any suitable manner, such as with analog circuitry, digital circuitry, instructions for execution by a processor, ASIC, FPGA, or any suitable combination thereof. PWMH runt counter 204 may be configured to determine, fully or in part, whether an incoming PWMH signal has a sustained value—whether one or zero—long enough to avoid being considered a runt signal. PWMH runt counter 204 may be configured to access any suitable information for a defined threshold of a runt signal, such as runt count 210. Runt count 210 may be, for example, four, for the purposes of illustration in the present disclosure. Runt count 210 may be stored in, for example, registers.

Similarly, adjustment circuit 110 may include a PWML runt counter 212. PWML runt counter 212 may be implemented in any suitable manner, such as with analog circuitry, digital circuitry, instructions for execution by a processor, ASIC, FPGA, or any suitable combination thereof. PWML runt counter 212 may be configured to determine, fully or in part, whether an incoming PWML signal has a sustained value—whether one or zero—long enough to avoid being considered a runt signal. PWML runt counter 212 may be configured to access any suitable information for a defined threshold of a runt signal, such as runt count 210.

In one example, adjustment circuit 110 may include a PWM output circuit 206. PWM output circuit 206 may be implemented in any suitable manner, such as with analog circuitry, digital circuitry, instructions for execution by a processor, ASIC, FPGA, or any suitable combination thereof. PWM output circuit 206 may be configured to stretch an incoming PWMH signal that is a runt signal to yield a PWMH (adj.) signal that is not a runt signal. PWM output circuit 206 may be configured to stretch an incoming PWML signal that is a runt signal to yield a PWML (adj.) signal that is not a runt signal.

PWM output circuit 206 may be configured to stretch a portion of such signals at a given logical value, artificially delaying the transition from the given logical value to the other logical value. For example, a PWMH or PWML signal with a logic high pulse that lasts for three clock cycles, wherein a runt count 210 value is four, may be stretched so that the logic high pulse lasts four clock cycles. In another example, a PWMH or PWML signal with a logic low pulse that lasts for three clock cycles, wherein a runt count 210 value is four, may be stretched so that the logic low pulse lasts four clock cycles. The stretching of the value may be performed at the expense of an immediately subsequent part of the PWMH or PWML signal. For example, given a PWMH or PWML signal with a logic high pulse that lasts for three clock cycles followed by a logic low pulse that lasts for six clock cycles, PWM output circuit 206 may be configured to stretch the logic high pulse to four clock cycles and reduce the logic low pulse to five clock cycles.

In one example, PWM output circuit 206 may be configured to delay PWMH and PWML signals to generate PWMH (adj.) and PWML (adj.) signals according to the delay specified in delay count 208.

PWM output circuit 206 may be configured to stretch an incoming PWML or PWMH through the use of counters, such as PWMH runt counter 204 and PWML runt counter 212. Upon a changed edge of PWMH, PWMH runt counter 204 may be configured to count clock cycles to a quantity specified by runt count 210. PWMH runt counter 204 may be configured to provide any suitable signal indicating the current count of clock cycles or the completion of the clock cycle quantity specified by runt count 210.

The PWMH and PWML signals may be routed to PWM delay counter 202, PWMH runt counter 204, PWML runt counter 212, and PWM output circuit 206.

Upon a first changed edge of PWMH or PWML, PWM delay counter 202 may be configured to count clock pulses or cycles (not shown) until delay count 208 is reached. PWM delay counter 202 may be configured to count up to or down from delay count 208, in any suitable manner. PWM delay counter 202 may be configured to issue any suitable outputs to indicate whether or not PWM delay counter 202 is active and counting, inactive and not counting, or whether delay count 208 has been reached. For example, PWM delay counter 202 may be configured to issue a signal labeled "DELAY COUNT EXPIRED?" as shown in FIG. 2 that may be normally a zero or logic low but may be a positive pulse when delay count 208 is reached. "DELAY COUNT EXPIRED?" may be routed to PWMH runt counter 204, to PWML runt counter 212, and to PWM output circuit 206.

Output of PWM output circuit 206 may include PWMH (adj.) and PWML (adj.), and these signals may be routed to PWMH runt counter 204 and PWML runt counter 212. PWMH runt counter 204 may reload run count 210 upon changed edges of respective the PWMH signal. PWML runt counter 212 may reload run count 210 upon changed edges of respective the PWML signal. Runt count 210 may be read by PWMH runt counter 204 and PWML runt counter 212, or otherwise loaded therein. PWMH runt counter 204 and PWML runt counter 212 may be configured to then count clock pulses or cycles (not shown) that have elapsed until runt count 210 is reached. PWMH runt counter 204 and PWML runt counter 212 may be configured to count up to or down from runt count 210, in any suitable manner. PWMH runt counter 204 and PWML runt counter 212 may be configured to issue any suitable outputs to indicate whether or not PWMH runt counter 204 and PWML runt counter 212 are active and counting, inactive and not counting, or whether runt count 210 has been reached. For example, PWMH runt counter 204 may be configured to issue a signal labeled "PWMH RUNT COUNT EXPIRED?" as shown in FIG. 2 that may be normally a zero or logic low but may be a positive pulse when runt count 210 is reached. "PWMH RUNT COUNT EXPIRED?" may be routed to PWM output circuit 206. In another example (not shown), PWMH runt counter 204 may be configured to provide a current count to PWM output circuit 206. PWML runt counter 212 may be configured to issue a signal labeled "PWML RUNT COUNT EXPIRED?" as shown in FIG. 2 that may be normally a zero or logic low but may be a positive pulse when runt count 210 is reached by PWML runt counter 212. "PWML RUNT COUNT EXPIRED?" may be routed to PWM output circuit 206. In another example (not shown), PWML runt counter 212 may be configured to provide a current count to PWM output circuit 206.

In one example, operation of PWMH runt counter 204 and PWML runt counter 212 to count clock pulses or cycles until runt count 210 is reached may be gated or dependent upon whether delay count 208 has been reached by PWM delay counter 202. Thus, runt count 210 may be counted if "DELAY COUNT EXPIRED?" has been signaled as true from PWM delay counter 202, but otherwise, not performed.

PWM output circuit 206 may be configured to receive "DELAY COUNT EXPIRED?", the PWMH signal, the PWMH (adj.) signal in feedback (not shown), the PWML signal, the PWML (adj.) signal in feedback (not shown), "PWMH RUNT COUNT EXPIRED?", "PWML RUNT COUNT EXPIRED?", and the actual counts (not shown) of counters 204, 212.

PWM output circuit 206 may be configured to determine whether or not PWMH or PWML reflect runt pulses and, if so, stretch such pulses by extending the pulse until the pulse is larger than the defined length of runt count 210. In one example, a stretched pulse might be absorbed by a subsequent pulse. The subsequent pulse may be the immediately subsequent pulse. The immediately subsequent pulse may be of an opposite polarity of the stretched post. The absorption of the stretched pulse by the subsequent pulse may include a shortening of the subsequent pulse in the same number of clock cycles by which the stretched pulse is extended. For example, if a given pulse has a logical one value for three clock cycles that is stretched into four clock cycles, the first clock cycle of the subsequent logical zero value pulse may be ignored or discarded. Thus, the timing of further subsequent pulses may be maintained, rather than delayed by the stretching of the runt pulse. Moreover, if this absorption causes the subsequent pulse to itself become a runt pulse, the subsequent pulse may itself be stretched so that it is not a runt pulse. Furthermore, such a stretching may be absorbed by yet another subsequent pulse. Thus, the timing of yet further subsequent pulses may be maintained.

PWM output circuit 206 may be configured to issue PWMH (adj.) and PWML (adj.) as adjusted or changed by delays and runt pulse adjustments, such as stretching or gobbling (discussed in more detail within the context of FIGS. 5-6, below).

FIG. 3 is a more detailed illustration of portions of adjustment circuit 110, according to examples of the present disclosure. FIG. 3 may illustrate pseudocode or example logic for the operation of various components of adjustment circuit. Those of skill in the art will recognize implementations in analog circuitry, digital circuitry, instructions for execution by a processor, or any suitable combination thereof.

PWM delay counter 202 may be configured to reset upon a rising edge of PWMH, though in various examples, a rising or falling edge of PWMH or PWML may be chosen. PWM delay counter 202 may be loaded with the value of delay count 208 and, after being reset, may begin counting up or down to the value of delay count 208 in terms of clock cycles. After reaching the end of the count, PWM delay counter 202 may be configured to signal the result on "DELAY COUNT EXPIRED?" to PWMH runt counter 204, PWML runt counter 212, and PWM output circuit 206.

PWMH runt counter 204 may be configured to wait for a changed edge on PMWH. Such a changed edge may be zero to one, or one to zero. Upon recognition of the changed edge, PWMH runt counter 204 may be configured to load the value of runt count 210 into the counter. PWMH runt counter 204 may be configured to wait for a determination that the delay count has expired, which may be provided by PWM delay counter 202. Upon a determination that the delay count has expired, PWMH runt counter 204 may be configured to begin counting clock cycles. The counting may be up to the value of runt count 210 or down from the value of runt count 210.

PWMH runt counter 204 may be configured to then repeatedly perform a series of steps or further operations. These repeated operations may include issuing a signal, such as "PWMH RUNT COUNT EXPIRED?", indicating whether or not the value of runt count 210 loaded into PWMH runt counter 204 has been reached. These repeated operations may also include issuing (not shown) the actual, present count of PWMH runt counter 204. These signals may be issued to, for example, PWM output circuit 206. These repeated operations may include a determination of whether a changed edge has been observed on PWMH and a changed edge on PMWH (adj.) since the last time PWMH runt counter 204 was loaded or reloaded with the value of runt count 210. Such a changed edge on PWMH may indicate that the PWMH signal is ready to be evaluated again. Moreover, such a changed edge on PWMH (adj.) may indicate that PWM output circuit 206 has stretched, if necessary, any portion of PWMH (adj.) signal to avoid PWMH (adj.) being a runt pulse. Without evaluation of the changed edge on PWMH (adj.), PWMH runt counter 204 might not otherwise take into account that the previous pulse has been stretched. These repeated operations may further include counting down or counting up to the value of runt count 210. If PWMH runt counter 204 has finished counting up or down to the value of runt count 210, the count value may be maintained.

Similarly, and in parallel with PWMH runt counter 204 operations as described above, PWML runt counter 212 may be configured to wait for a changed edge on PMWL. Such a changed edge may be zero to one, or one to zero. Upon recognition of the changed edge, PWML runt counter 212 may be configured to load the value of runt count 210 into the counter. PWML runt counter 212 may be configured to wait for a determination that the delay count has expired, which may be provided by PWM delay counter 202. Upon a determination that the delay count has expired, PWML runt counter 212 may be configured to begin counting clock cycles. The counting may be up to the value of runt count 210 or down from the value of runt count 210.

PWML runt counter 212 may be configured to then repeatedly perform a series of steps or further operations. These repeated operations may include issuing a signal, such as "PWML RUNT COUNT EXPIRED?", indicating whether or not the value of runt count 210 loaded into PWML runt counter 212 has been reached. These repeated operations may also include issuing (not shown) the actual, present count of PWML runt counter 212. These signals may be issued to, for example, PWM output circuit 206. These repeated operations may include a determination of whether a changed edge has been observed on PWML and a changed edge on PMWL (adj.) since the last time PWML runt counter 212 was loaded or reloaded with the value of runt count 210. Such a changed edge on PWML may indicate that the PWML signal is ready to be evaluated again. Moreover, such a changed edge on PWML (adj.) may indicate that PWM output circuit 206 has stretched, if necessary, any portion of PWML (adj.) signal to avoid PWML (adj.) being a runt pulse. Without evaluation of the changed edge on PWML (adj.), PWML runt counter 212 might not otherwise take into account that the previous pulse has been stretched. These repeated operations may further include counting down or counting up to the value of runt count 210. If PWML runt counter 212 has finished counting up or down to the value of runt count 210, the count value may be maintained.

PWM output circuit 206 may be configured to initially output, as a default, a logical zero for PWMH (adj.) and PWML (adj.). PWM output circuit 206 may be configured to configured to wait for a changed edge on PWMH or PWML. PWM output circuit 206 may be configured to then sample PWMH and PWML. PWM output circuit 206 may be configured to perform this by, for example, a sample and hold operation. PWM output circuit 206 may be configured to then wait for the delay count to expire as indicated by PWM delay counter 202.

PWM output circuit 206 may then be configured to determine whether the PWMH and PWML signals indicate a PWMH high pulse and a PWML low pulse, or a PWMH low pulse and a PWML high pulse. This may be determined by, for example, a rising edge of PWMH or falling edge of PWML indicating a PWMH high pulse and a PWML low pulse, or a falling edge of PWMH or rising edge of PWML indicating a PWMH low pulse and a PWML high pulse.

PWM output circuit 206 may repeatedly perform operations until a changed edge is received on PWMH and PWML. Moreover, PWM output circuit 206 may repeatedly perform two different sets of operation in parallel during a same clock cycle. The two different sets of operation may correspond to respective generation of PWML (adj.) and PWMH (adj.).

Illustrated in FIG. 3 are two different use cases. In a first case, the PWMH and PWML signals indicate a PWMH high pulse and a PWML low pulse. In a second case, the PWMH and PWML signals indicate a PWMH low pulse and a PWML high pulse. The evaluation of these cases may be performed against after changed edges on PWMH and PWML.

In the first case, if the PWML or PWMH signals indicate a PWMH high pulse and a PWML low pulse, PWM output 206 may be configured to determine whether PWMH is now a logic zero and the PWMH runt count has not yet expired. This may reflect a situation wherein PWMH, which was in a high pulse operation, has transitioned to becoming a low pulse, but has done so before the high pulse was long enough to avoid being a runt pulse. Thus, this may reflect a runt pulse detection of PWMH. In such a case, the output on PWMH (adj.) may be held as a logic one value. The previously sampled PWMH value may be discarded or otherwise not used. Otherwise, if PWMH has not been determined to be a runt pulse, the output on PWMH (adj.) may be the sampled value of PWMH.

In parallel, wherein the PWML or PWMH signals indicate a PWMH low pulse and a PWML high pulse, PWM output 206 may be configured to determine whether PWML is now a logic one and the PWML runt count has not yet expired. This may reflect a situation wherein PWML, which was in a low pulse operation, has transitioned to becoming a high pulse, but has done so before the low pulse was long enough to avoid being a runt pulse. Thus, this may reflect a runt pulse detection of PWML. In such a case, the output on PWML (adj.) may be held as a logic zero value. The previously sampled PWML value may be discarded or otherwise not used. Otherwise, if PWML has not been determined to be a runt pulse, the output on PWML (adj.) may be the sampled value of PWML.

Following the parallel determination of the output of PWMH (adj.) and PWML (adj.), PWMH and PWML may again be sampled. The parallel operations of determining the output of PWMH (adj.) and PWML (adj.), and sampling PWMH and PWML, may be repeated until a changed edge occurs, respectively, on PWMH or PWML.

In the second case, if the PWML or PWMH signals indicate a PWMH low pulse and a PWML high pulse, PWM output 206 may be configured to determine whether PWMH is now a logic one and the PWMH runt count has not yet expired. This may reflect a situation wherein PWMH, which was in a low pulse operation, has transitioned to becoming a high pulse, but has done so before the low pulse was long enough to avoid being a runt pulse. Thus, this may reflect a runt pulse detection of PWMH. In such a case, the output on PWMH (adj.) may be held as a logic zero value. The previously sampled PWMH value may be discarded or otherwise not used. Otherwise, if PWMH has not been determined to be a runt pulse, the output on PWMH (adj.) may be the sampled value of PWMH.

In parallel, wherein the PWML or PWMH signals indicate a PWMH low pulse and a PWML high pulse, PWM output 206 may be configured to determine whether PWML is now a logic zero and the PWML runt count has not yet expired. This may reflect a situation wherein PWML, which was in a high pulse operation, has transitioned to becoming a low pulse, but has done so before the high pulse was long enough to avoid being a runt pulse. Thus, this may reflect a runt pulse detection of PWML. In such a case, the output on PWML (adj.) may be held as a logic one value. The previously sampled PWML value may be discarded or otherwise not used. Otherwise, if PWML has not been determined to be a runt pulse, the output on PWML (adj.) may be the sampled value of PWML.

Following the parallel determination of the output of PWMH (adj.) and PWML (adj.), PWMH and PWML may again be sampled. The parallel operations of determining the output of PWMH (adj.) and PWML (adj.), and sampling PWMH and PWML, may be repeated until a changed edge occurs, respectively, on PWMH or PWML.

Figure 4:
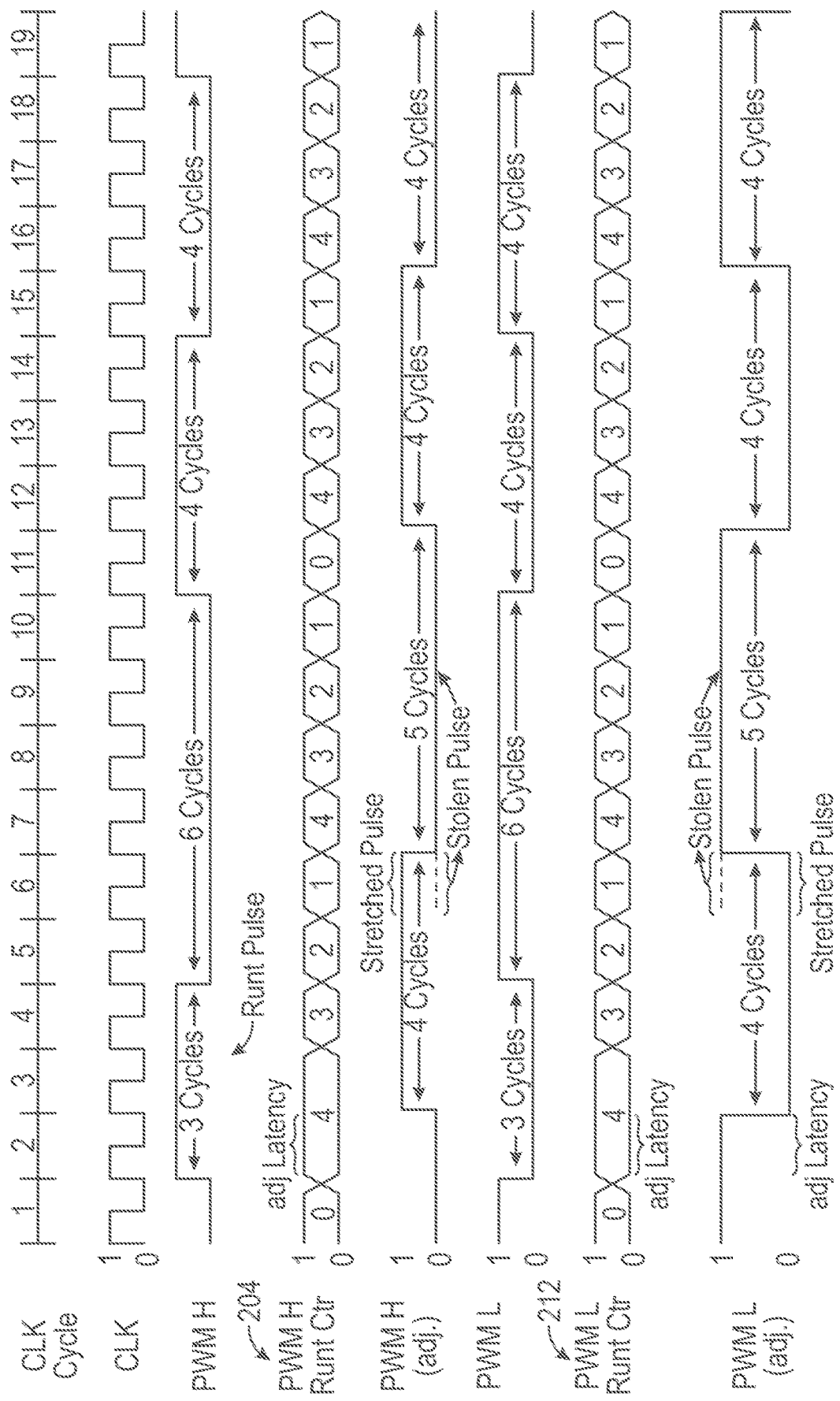
FIG. 4 is an illustration of operation of an adjustment circuit to stretch runt pulses, according to examples of the present disclosure.

FIG. 4 is an illustration of operation of adjustment circuit 110 to stretch runt pulses, according to examples of the present disclosure. FIG. 4 may, in particular, illustrate operation of adjustment circuit 110 as illustrated in FIGS. 2-3.

Illustrated in FIG. 4 are timing diagrams of PWMH and PWML input signals, values and timing diagrams of PWMH runt counter 204 and PWML runt counter 212. Also illustrated are timing diagrams of PWMH (adj.) and PWML (adj.) signals that result from PWM output circuit 206. Also illustrated in FIG. 4 are timing diagrams of an example clock signal. Operation of delay counters such as PWM delay counter 202 are omitted from FIG. 4 for the ease of illustration, but such delays are illustrated with a one-cycle clock delay in FIG. 4. The runt count of FIG. 4 may be given as four.

Input of PWMH and PWML may be evaluated upon rising edges of the clock signal. For example, a newly created pulse with a one or logic high value may be recorded at the beginning of clock cycle 2 for PWMH. This pulse may be three cycles long, ending at the beginning of clock cycle 5. This may be a runt pulse, as it is insufficiently long to exceed the runt count—that is, four. PWM runt counter 204 may be loaded with the value of runt count 210 (that is, four) upon detection of the rising edge of the PWMH pulse at clock cycle 2. However, due to the delay of the system, which may be one clock cycle and may arise from, for example, system latency, PWM runt counter 204 might not begin counting clock cycles until clock pulse 3. This is shown in FIG. 4 as "adj. latency". Beginning at clock cycle 3, PWMH runt counter 204 might count down from four.

Output of PWMH as PWMH (adj.) may be held for the same duration of the delay, which may be one clock cycle.

Beginning at clock cycle 3, PWMH may be output as PWMH (adj.), wherein a logic high or value of one is output.

Upon detection of a logic low or zero value of PWMH at clock cycle 5, the logic high or one value in PWMH (adj.) may nonetheless be preserved until PWMH runt counter 204 would reach zero at the start of clock cycle 7. As a result, the duration of the pulse as issued in PWMH (adj.) may be four cycles, in contrast with the duration of the pulse as originally received in PWMH, which was three cycles. The pulse, as issued in PWMH (adj.), may thus be stretched an additional clock cycle, preventing a runt pulse in PWMH (adj.) Upon the determination that PWMH has transitioned previously at the start of clock cycle 5, and the determination that PWMH (adj.) has transitioned at the start of clock cycle 7 after being stretched, PWMH runt counter 204 may be reloaded with the runt count (that is, four), at the start of clock cycle 7.

PWMH may now be in a low pulse operation. The low pulse of PWMH may extend from clock cycle 5 through clock cycle 11, a duration of six clock cycles. This is sufficiently long and is not a runt pulse. Accordingly, this pulse might not be stretched. Moreover, the stretching of PWMH (adj.) based upon the runt pulse previously detected may be performed at the expense of the duration of this six-clock cycle low pulse. The low pulse of PWMH between cycles 5 and 11 may be output as a low pulse of PWMH (adj.) between cycles 7 and 12, which is reduced to five cycles. The missing cycle from this low pulse may be referred to as a stolen pulse. At clock cycle 12, PWMH runt counter 204 may have already reached zero in clock cycle 11, and a transition in PWMH may have been determined in clock cycle 11. This transition may be delayed according to delay count 208 before being applied or evaluated for PWMH (adj.) output.

Similarly, PWML may include a newly created pulse with a zero or logic low value may that is recorded at the beginning of clock cycle 2. In the example of FIG. 4, PWML may be an inverse of PWMH. This pulse may be three cycles long, ending at the beginning of clock cycle 5. This may be a runt pulse, as it is insufficiently long to exceed the runt count—that is, four. PWML runt counter 212 may be loaded with the value of runt count 210 (that is, four) upon detection of the falling edge of the PWML pulse at clock cycle 2. However, due to the delay of the system, which may be one clock cycle and may arise from, for example, system latency, PWML runt counter 212 might not begin counting clock cycles until clock pulse 3. This is shown in FIG. 4 as "adj. latency". Beginning at clock cycle 3, PWML runt counter 212 might count down from four.

Output of PWML as PWML (adj.) may be held for the same duration of the delay, which may be one clock cycle. Beginning at clock cycle 3, PWML may be output as PWML (adj.), wherein a logic low or value of zero is output.

Upon detection of a logic high or one value of PWML at clock cycle 5, the logic low or zero value in PWML (adj.) may nonetheless be preserved until PWML runt counter 204 would reach zero at the start of clock cycle 7. As a result, the duration of the pulse as issued in PWML (adj.) may be four cycles, in contrast with the duration of the pulse as originally received in PWML, which was three cycles. The pulse, as issued in PWML (adj.), may thus be stretched an additional clock cycle, preventing a runt pulse in PWML (adj.) Upon the determination that PWML has transitioned previously at the start of clock cycle 5, and the determination that PWML (adj.) has transitioned at the start of clock cycle 7 after being stretched, PWML runt counter 212 may be reloaded with the runt count (that is, four), at the start of clock cycle 7.

PWML may now be in a high pulse operation. The high pulse of PWML may extend from clock cycle 5 through clock cycle 11, a duration of six clock cycles. This is sufficiently long and is not a runt pulse. Accordingly, this pulse might not be stretched. Moreover, the stretching of PWML (adj.) based upon the runt pulse previously detected may be performed at the expense of the duration of this six-clock cycle high pulse. The high pulse of PWML between cycles 5 and 11 may be output as a high pulse of PWML (adj.) between cycles 7 and 12, which is reduced to five cycles. The missing cycle from this high pulse may be referred to as a stolen pulse. At clock cycle 12, PWML runt counter 212 may have already reached zero in clock cycle 11, and a transition in PWML may have been determined in clock cycle 11. This transition may be delayed according to delay count 208 before being applied or evaluated for PWML (adj.) output.

As shown in FIG. 4, PWMH and PWML signals for a given clock cycle may be propagated or adjusted at a later clock cycle as PWMH (adj.) or PWML (adj.), due to the delay of the system. Thus, to determine PWMH (adj.) or PWML (adj.) for a given clock cycle, the sampling of PWMH and PWML signals as discussed within the context of FIGS. 2-3 may be of PWMH and PWML as such signals existed at a previous clock cycle compared to the given clock cycle. The difference between the given clock cycle and the previous clock cycle may be the delay of the system as given in delay count 208.

Figure 5:
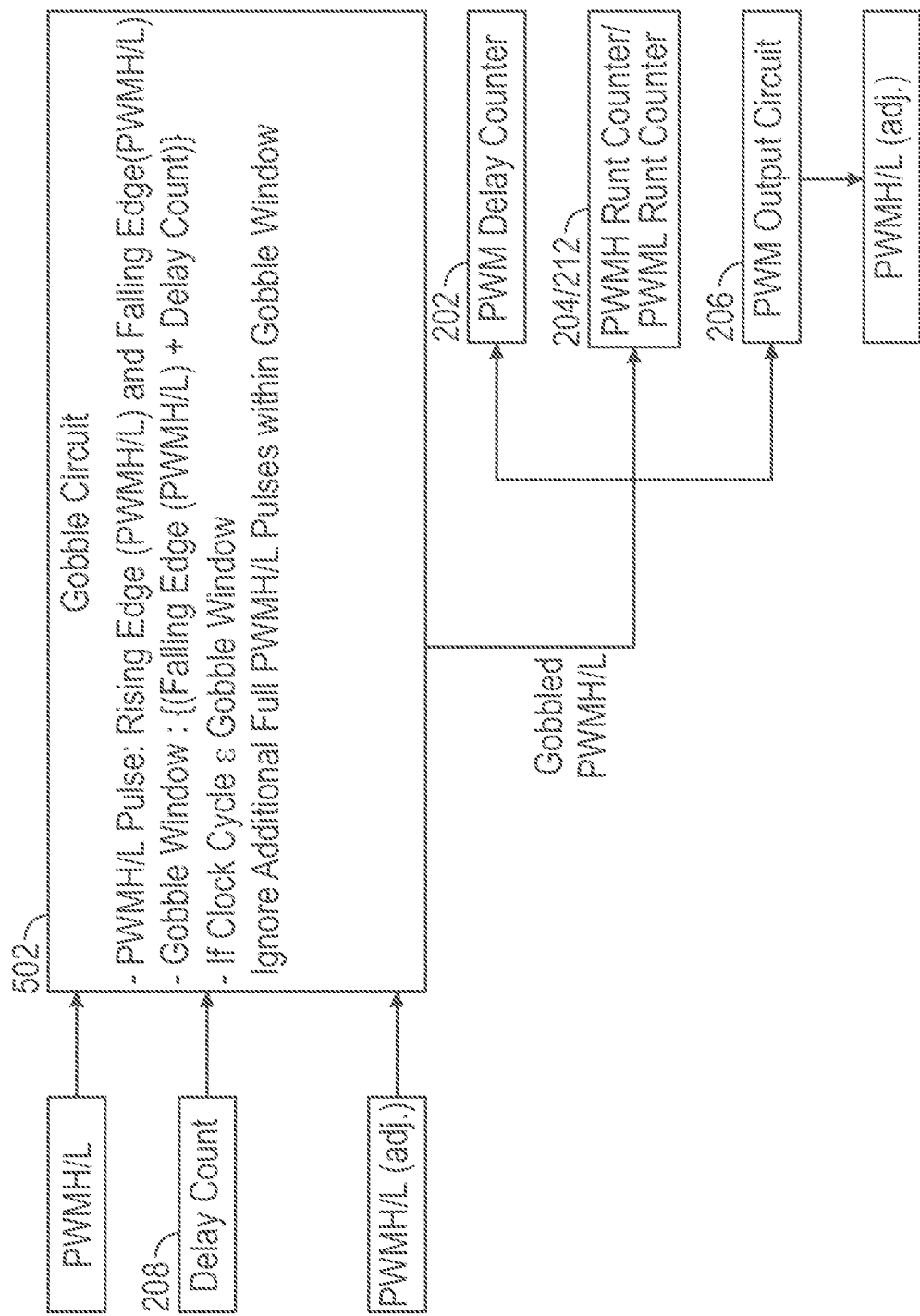
FIG. 5 is an illustration of a gobble circuit, according to examples of the present disclosure.

FIG. 5 is an illustration of a gobble circuit 502, according to examples of the present disclosure. Gobble circuit 502 may be configured to evaluate a PWMH or PWML signal and eliminate pulses from the signal, or from resultant PWMH (adj.) or PWML (adj.) signals. For example, gobble circuit 502 may be implemented in FIG. 3 in a position between PWMH/L signal inputs and counters 202, 204, 212 and PWM output circuit 206. Thus, implementation of adjustment circuit 110 in FIG. 3 may be augmented by insertion of gobble circuit 502 to receive the inputs PWMH/L as shown therein and provide gobbled PWMH/L signals as PWMH/L to counters 202, 204, 212 and PWM output circuit 206.

Gobble circuit 502 may be implemented in any suitable manner, such as with analog circuitry, digital circuitry, instructions for execution by a processor, ASIC, FPGA, or any suitable combination thereof. A single gobble circuit 502 may be used for both PWMH and PWML signals, or separate instances of gobble circuit 502 may be used for PWMH and PWML signals. Moreover, gobble circuit 502 may be implemented independently in, for example, in adjustment circuit 110, or within PWM peripheral circuit 126 between PWM generation circuit 108 and adjustment circuit 110. For example, as shown in FIG. 5, gobble circuit 502 may be configured to receive PWMH or PWML signals, perform gobbling on such signals, and pass the result to one or more of counters 202, 204, 212 or circuits 110, 206. In such examples, gobble circuit 502 may configured to provide the PWMH or PWML input signals shown in FIGS. 2-4. Such input PWMH or PWML signals to those elements shown in FIGS. 2-4 may be represented in FIG. 5 as gobbled PWMH or gobbled PWML. In other examples, gobble circuit 502 may be implemented within one or more of counters 202, 204, 212, or circuits 206, 110. In such examples, the configuration of gobble circuit 502 may be added to one or more of counters 202, 204, 212, or circuits 206, 110 to further augment the functionality and configurations shown in FIGS. 2-4. In the discussion of FIG. 5, the ability of gobble circuit 502 to be applicable to either or both of PWMH and PWML signals may be referenced by "PWMH/L."

Gobble circuit 502 may be configured to receive PWMH, PWML signals, PWMH (adj.), PWML (adj.) signals, and to receive delay count 208.

Gobble circuit 502 may be configured to evaluate pulses during a gobble window and to eliminate such pulses as they occur during the gobble window. The gobble window may be given as a range of time defined by clock cycles wherein pulses should not appear. Such pulses may or may not be a runt pulse. The gobble window may include a range of clock cycles after the PWMH/L pulse has completed. The PWMH/L pulse may be complete wherein the PWMH/L originally transitioned from a low logic level to a high logic level (initiating operation of counters, etc. of adjustment circuit 110) followed by a transition back to the low logic level. The gobble window may include the range of clock cycles after the PWMH/L has completed and while adjustment circuit 110 is still processing the pulse. Processing the pulse may include waiting for the delay defined by delay count 208. Moreover, processing the pulse may include waiting for expiration of the runt count as counted by PWMH runt counter 204 or PWML runt counter 212. Thus, in one example the gobble window may be given as the clock cycles between A) a clock cycle of the falling edge of the PWMH/L signal, and B) a clock cycle equal to the delay count added to the clock cycle of A). In another example, the gobble window may be given as the clock cycles between A) a clock cycle of the falling edge of the PWMH/L signal, and B) a clock cycle equal to the delay count and the runt count added to the clock cycle of A).

In one example, gobble circuit 502 may be configured to suppress any completed pulses that occur during the gobble window. Such pulses may be suppressed from the PWMH/L signals that are provided to counters 202, 204, 212, or circuits 206, 110, or may be suppressed during the operation of counters 202, 204, 212, or circuits 206, 110. In any such cases, such pulses may be suppressed from the resultant PWMH/L (adj.) signal. In another example, gobble circuit 502 may be configured to allow an incomplete pulse that occurs during the gobble window. An incomplete pulse may include, for example, an individual transition from a low logic level to a high logic level that is unpaired with a transition back to the low logic level during the gobble window. Such transitions may be manifested in the resultant PWMH/L (adj.) signal.

Thus, as shown in FIG. 5, a PWMH/L pulse may be given as a rising edge of PWMH/L followed by a falling edge of PWMH/L within the gobble window. The gobble window may be given as the range of clock cycles from a falling edge of the PWMH/L signal plus the delay count. During the processing of PWMH/L during the gobble window, it may be determined whether there are any additional PWMH/L pulses. If there are any such additional PWMH/L pulses, they may be suppressed. The PWMH/L pulse values may be ignored and handled as-if the value of the PWMH/L signal was logic low or zero. A gobbled PWMH/L signal may be generated, wherein any pulses within the gobble window were ignored. The gobbled PWMH/L signal may be used by any other suitable portion of adjustment circuit 110 as an input PWMH/L signal.

Figure 6:
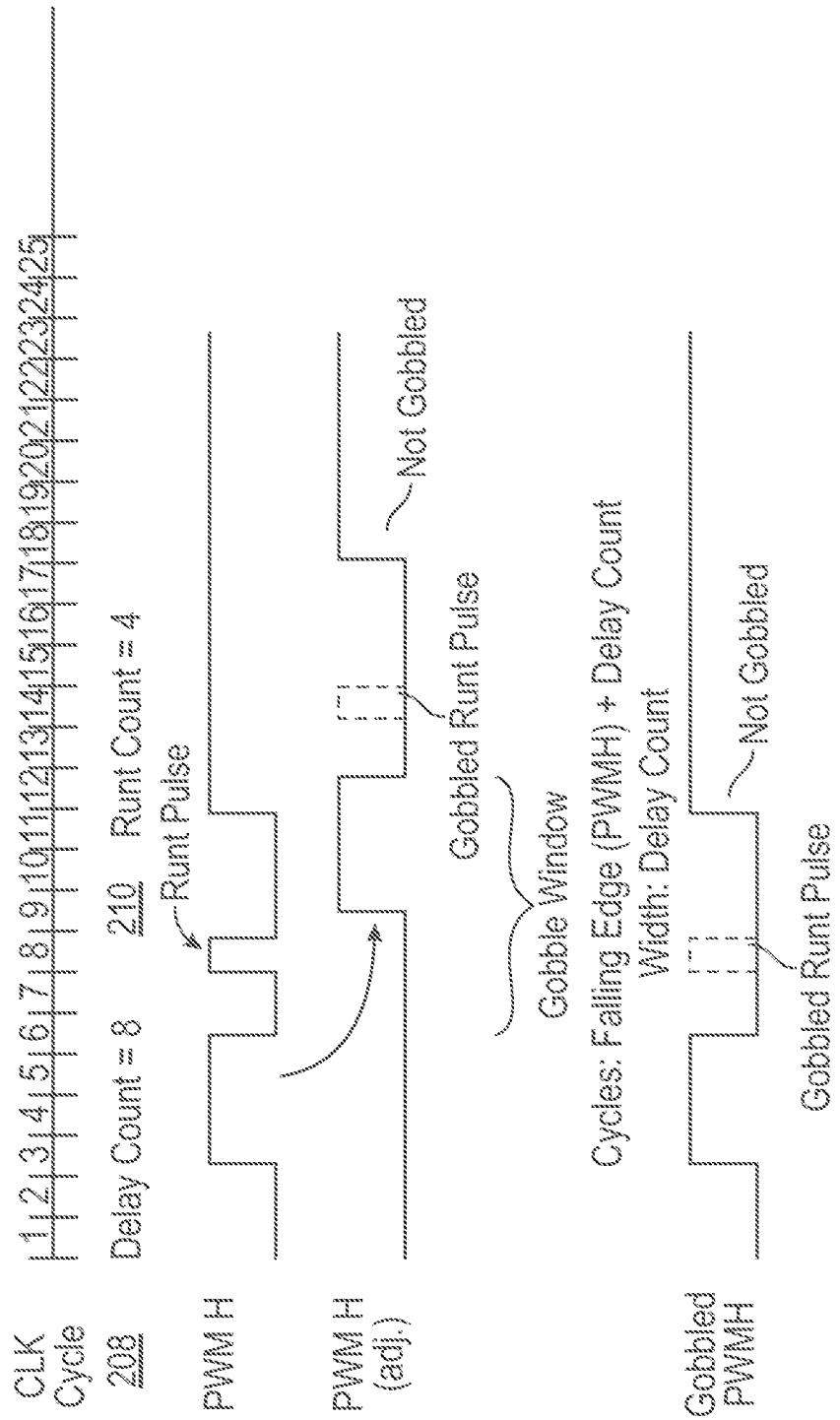
FIG. 6 is an illustration of a timing diagram showing pulse gobbling, according to examples of the present disclosure.

FIG. 6 is an illustration of a timing diagram showing pulse gobbling, according to examples of the present disclosure. FIG. 6 may illustrate example operation of gobble circuit 502 within the context of other elements of FIGS. 1-5.

In FIG. 6, delay count 208 may be eight. Moreover, runt count 210 may be four. In FIG. 6, a PWMH signal is illustrated for example purposes. A PWML signal may be similarly handled.

At clock cycle 4, a pulse on PWMH may begin to be received. The pulse may be four clock cycles long, and thus not a runt pulse. As the delay count is eight, the pulse might not appear in PWMH (adj.) until beginning at clock cycle 12.

In FIG. 6, the gobble window may be the range of clock cycles between block cycle 8 and clock cycle 16. This may correspond to the falling edge of PWMH at clock cycle 8 plus eight clock cycles (which may be the value of delay count 208).

There may be several transitions to consider within the gobble window shown in FIG. 6 for the PWMH signal. First, a pulse is received on clock cycle 10. The pulse may be a complete pulse, with a rising edge of the PWMH signal, followed by a falling edge of the PWMH signal, all within the gobble window. Gobble circuit 502 may be configured to ignore this pulse and remove it from gobbled PWMH or PWMH (adj.), or to cause other elements, such as circuits 206, 110 to remove it from being issued on PWMH/L (adj.). At clock cycle 18 of PWMH (adj.) or at clock cycle 10 of the gobbled PWMH signal, the value of the signal may be held logic low.

Second, a rising edge may be received on clock cycle 15 for the PWMH signal. This may be within the gobble window. However, the gobble window may end before the corresponding falling edge for the PWMH signal is received. Thus, this transition may be maintained by gobble circuit 502. The transition may appear in clock cycle 23 of PWMH (adj.) or clock cycle 15 for the gobbled PWMH signal.

Figure 7:
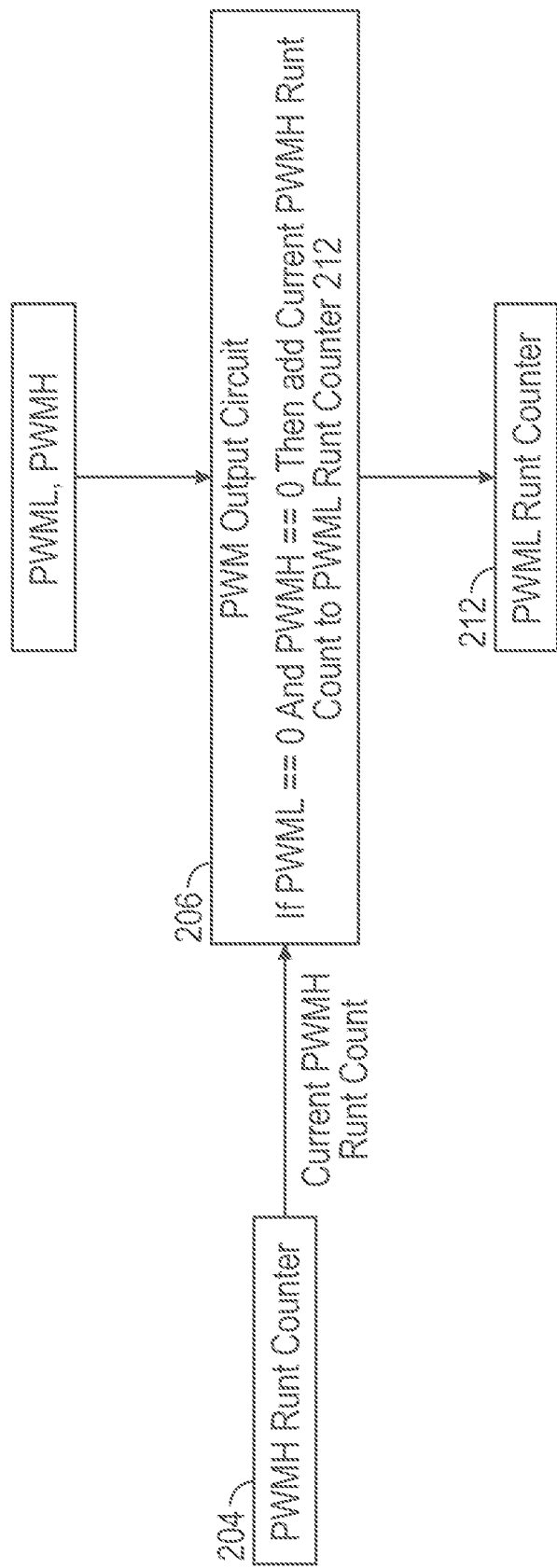
FIG. 7 is an illustration of a further implementation of runt counters to account for down time of PWM signals, according to examples of the present disclosure.

FIG. 7 is an illustration of a further implementation of runt counters to account for down time of PWM signals, according to examples of the present disclosure. Down time may include clock cycles wherein both PWMH and PWML are at a logic low value. Down time may be preserved in the output of PWMH (adj.) and PWML (adj.) signals. Shown are example implementations of PWMH runt counter 204, PWM output circuit 206, and runt count 310. The implementations shown in FIG. 7 may be in addition to the configurations of these elements described in conjunction with FIGS. 2-6. Unchanged portions of FIGS. 2-6 are not shown in FIG. 7. Moreover, compared to FIGS. 2-3, PWM output circuit 206 and PWMH runt counter 204 may be changed to account for downtime when a runt pulse is detected.

In PWM downtime, both PWMH and PWML may be logic low for a designated or intended period of time. The period of time may be, for example, two clock cycles. The downtime may be configured to switch off both of devices 116, 118 for any suitable purpose. For example, the downtime may be scheduled, performed on the basis of an error condition, performed in anticipation of a possible error condition, periodically, or upon any other suitable criteria.

Pulse stretching after identification of a runt pulse may cause problems for PWM downtime. For example, by stretching the length of a logic high portion of a PWMH signal, the deadtime may otherwise be partially or fully overwritten. Thus, PWM output circuit 206 may be configured to recognize that a runt signal in PWMH/L exists, that a downtime exists, and to account for the possible downtime so that it may be preserved.

PWM output circuit 206 may be configured to determine that a runt signal exists as described above in conjunction with FIG. 2. For example, PWM output circuit 206 may determine that a runt signal exists if PWMH is a logic low value and PWM runt counter 204 has not indicated that the runt count has expired. As shown in FIG. 2, PMWH output circuit 206 then force output of PWMH (adj.) to be a logic high value.

In one example, PWM output circuit 206 may be configured to determine that PWM downtime is expected. PWM output circuit 206 may be configured to make such a determination by identifying that both PWMH and PWML both have a logic low value.

Based upon a determination that PWM downtime is expected, PWM output circuit 206 may be configured to take any suitable corrective action to account for the expected PWM downtime. In one example, PWM output circuit 206 may be configured to account for the expected PWM downtime. In one example, PWM output circuit 206 may be configured to issue a longer period of logic low signals as PWML (adj.) to account for the expected PWM downtime. PWM output circuit 206 may be configured to issue a longer period of logic low signals as PWML (adj.) in any suitable manner. For example, PWM output circuit 206 may be configured to extend a runt count of PWML runt counter 212. This may be performed by changing a value of the runt count stored in or currently maintained by PWML runt counter 212. In one example, PWM output circuit 206 may be configured to add the current value of PWMH runt counter 204 to the runt count to be used by PWML runt counter 212 for a next or concurrent PWML pulse.

Thus, PWMH runt counter 204 may be configured to continually provide a current value of the runt count therein to PWM output circuit 206, so that PWM output circuit 206 may change the runt count to be used by PWML runt counter 212 for the next or concurrent PWML pulse. The value of the runt count to be used by PWML runt counter 212 might be changed once per runt signal determination, rather than continuously resetting such a value.

Figure 8:
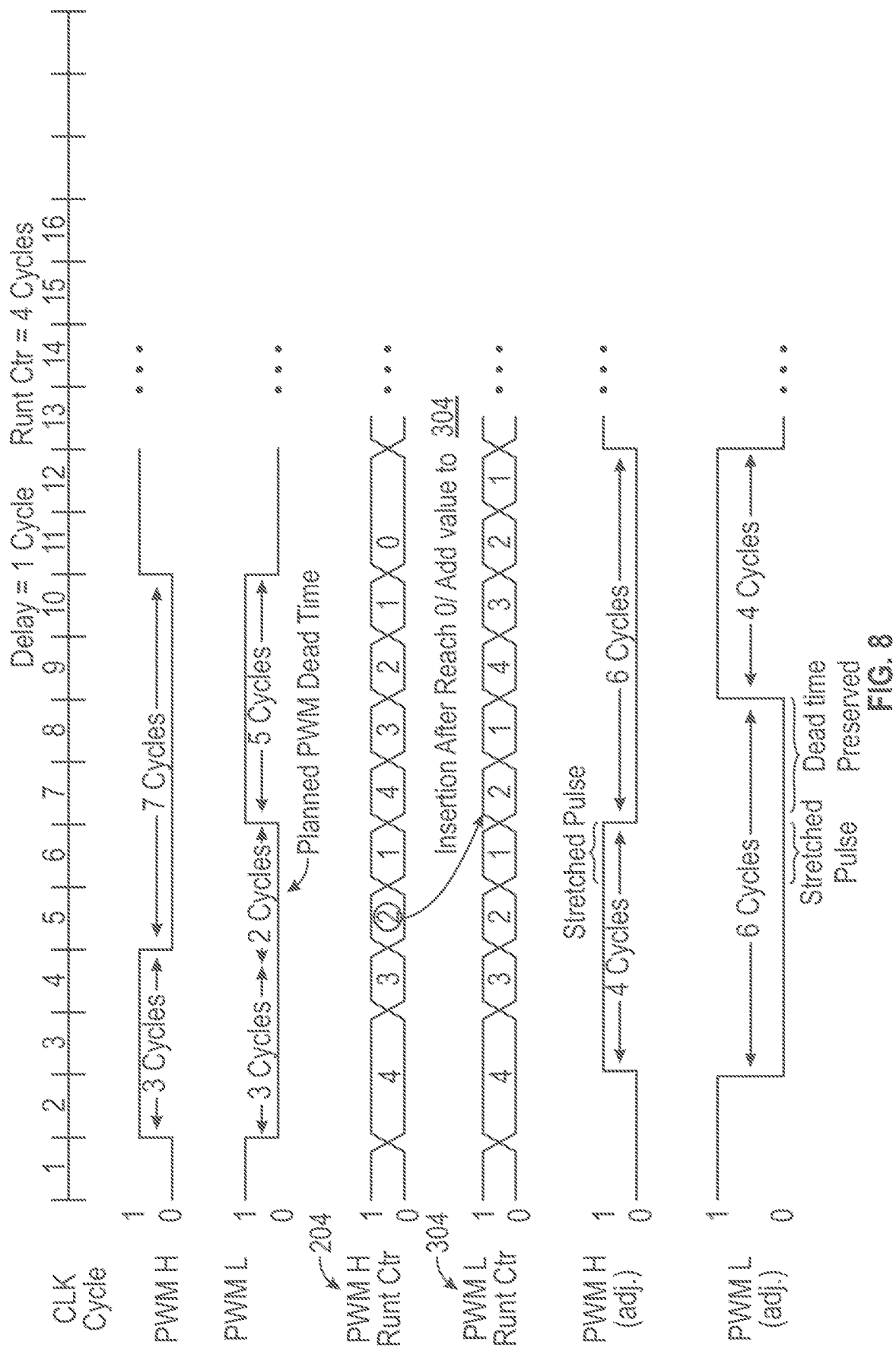
FIG. 8 is an illustration of a timing diagram for handling PWM downtime, according to examples of the present disclosure.

FIG. 8 is an illustration of a timing diagram for handling PWM downtime, according to examples of the present disclosure. FIG. 8 may illustrate example operation of PWM output circuit 206 as described within the context of FIG. 7, along within the context of other elements of FIGS. 1-5.

In FIG. 8, the value of runt count 210 may be four clock cycles, and the value of delay count 208 may be one cycle.

PWMH may be logic low, and then logic high beginning at cycle 1. The positive pulse beginning at cycle 1 may be three cycles long, followed by a logic low pulse for seven cycles, ending at clock cycle 12.

PWML may be logic low beginning at cycle 1 for five cycles. This may include three cycles at logic low corresponding to the logic high pulse of PWMH in the same period between cycles 2-5. Furthermore, this may include two additional clock cycles at logic low. These two additional clock cycles at logic low during clock cycles 5-6 in PWML may match two clock cycles at logic low during clock cycles 5-6 in PWMH. These two clock cycles at logic low for both PWML and PWMH may represent planned PWM downtime.

Thus, the first two clock cycles of the logic low pulse during clock cycles 5-11 in PWMH may be for planned PWM downtime, while the remaining portions of the logic low pulse during clock cycles 7-11 may correspond to a logic high of five clock cycles in PWML.

At clock cycle 5, PWMH runt counter 204 may have a count of two, having counted down from the initial value (four) of runt count 210 loaded at clock cycle two. Similarly, at clock cycle 5, PWML runt counter 212 may have a count of two.

At clock cycle 5, PWM output circuit 206 may determine that both the PWMH and PWML signals are a logic low. Consequently, PWM output circuit 206 may be configured to determine a present value of PWMH runt counter 204. In the example of FIG. 8, this value may be two. Furthermore, in one example PWM output circuit 206 may be configured to add such a present value to PWML runt counter 212. For example, PWM output circuit 206 may add two to PWML runt counter 212, which may then have a value of four. In another example and as shown in FIG. 8, PWM output circuit 206 may be configured to wait until the expiration of PWML runt counter 212 and then add the present value to PWML runt counter 212. Thus, after PWML runt counter 212 expires, it may be reloaded with a value of two. In such examples, after being changed by PWM output circuit 206, PWML runt counter 212 may then expire at clock cycle nine.

As a result, by delaying the expiration of PWML runt counter 212, PWML (adj.) might not transition to a high value until clock cycle nine. This may preserve the deadtime previously encountered in clock cycles 5-6.

Moreover, preservation of the deadtime may be made in addition to the operation described in FIGS. 2-6, wherein, for example, the logic high pulse of PWMH may be stretched, the logic low pulse of PWML may be stretched, the logic low pulse of PWMH may be shortened, and the logic high pulse of PWML may be shortened, to account for runt pulses.

Examples of the present disclosure may include an apparatus. The apparatus may include an adjustment circuit. The adjustment circuit may be implemented in any suitable manner, such as by analog circuitry, digital circuitry, digital logic, ASIC, FPGA, instructions for execution by a processor, or any suitable combination thereof. The apparatus may be part of a peripheral of a microcontroller. The adjustment circuit may be configured to receive a PWM input. The PWM input may be received from, for example, a PWM generation circuit. The PWM generation circuit may be implemented in any suitable manner, such as by analog circuitry, digital circuitry, digital logic, ASIC, FPGA, instructions for execution by a processor, or any suitable combination thereof.

The adjustment circuit may be configured to generate an adjusted PWM signal based upon the PWM input. As part of generating the adjusted PWM signal, the adjustment circuit may be configured to determine that a first pulse of the PWM input is shorter than a runt signal limit. The adjustment circuit may be configured to, in the adjusted PWM signal, extend the first pulse of the PWM input based on the determination that the PWM input is shorter than the runt signal limit, and to output the adjusted PWM signal to an electronic device.

In combination with any of the above examples, the apparatus may further include a counter. The counter may be configured to begin a determination of a length of the first pulse of the PWM input after a prescribed delay between the PWM input and the output of the adjusted PWM signal.

In combination with any of the above examples, the adjustment circuit may be further configured to, based upon extension of the first pulse, shorten a second pulse of the PWM input as included in the adjusted PWM signal, wherein the second pulse is immediately following the first pulse.

In combination with any of the above examples, the PWM input may include a PWML signal and a PWMH signal. The adjusted PWM signal may include an adjusted PWML signal and an adjusted PWMH signal. The PWMH signal and the PWML signal may include PWM signals and may be complements of each other during a plurality of clock cycles. The adjusted PWMH signal and the adjusted PWML signal may include PWM signals and to be complements of each other during a plurality of clock cycles. The adjustment circuit may be configured to selectively adjust the PWMH signal to generate the adjusted PWMH signal and to selectively adjust the PWML signal to generate the adjusted PWML signal.

In combination with any of the above examples, the apparatus may further include a counter configured to continuously determine lengths of respective pulses of the PWMH signal. The counter may be configured to begin determination of a length of a respective pulse of the PWMH signal after a changed edge on the PWMH signal and after a changed edge on the adjusted PWMH signal since a last reset of the counter.

In combination with any of the above examples, the first pulse and a second pulse may be of the PWMH signal. The adjustment circuit may be further configured to, based upon extension of the first pulse, shorten the second pulse to generate the adjusted PWMH signal, the second pulse immediately following the first pulse. The PWML signal may include a third pulse and a fourth pulse, the third pulse a complement of the first pulse. The fourth pulse may be a complement of the second pulse. The adjustment circuit may be configured to determine that the third pulse is a runt pulse, extend the third pulse based upon the determination that third pulse is a runt pulse and, based upon extension of third pulse, and shorten the fourth pulse to generate the adjusted PWML signal.

In combination with any of the above examples, the adjustment circuit may be further configured to determine that the PWMH signal and the PWML signal are simultaneously at a logic low value for a duration of clock cycles at a time after the first pulse, and preserve a state of the PWMH signal and the PWML signal at the logic low value for the duration of clock cycles in the adjusted PWMH signal and the adjusted PWML signal after the first pulse.

In combination with any of the above examples, the apparatus may further include a PWMH counter configured to count clock cycles beginning upon a changed edge of the PWMH signal and configured to determine whether a pulse of the PWMH signal is shorter than a runt count and thus classified as a runt pulse. The apparatus may further include a PWML counter configured to count clock cycles beginning upon a changed edge of the PWML signal and configured to determine whether a pulse of the PWML signal is shorter than a runt count and thus classified as a runt pulse. The adjustment circuit may be further configured to, upon a determination that the PWML signal and the PWMH signal are simultaneously at the logic low value for the duration of clock cycles, add a value of the PWMH counter to the PWML counter to preserve the state of the PWMH signal and the PWMH signal at the logic low value for the duration of clock cycles in the adjusted PWMH signal and the adjusted PWML signal.

Examples of the present disclosure may include a microcontroller including a PWM generation circuit and any of the apparatuses of the above examples.

Examples of the present disclosure may include methods performed by any of the apparatuses or microcontrollers of the above examples.

Although example examples have been described above, other variations and examples may be made from this disclosure without departing from the spirit and scope of these examples.

What is claimed is:

1. An apparatus, comprising:
an adjustment circuit to:
  receive a pulsed-width modulation (PWM) input;
  generate an adjusted PWM signal based upon the PWM input;
  determine that a first pulse of the PWM input is shorter than a runt signal limit;
  in the adjusted PWM signal, extend the first pulse of the PWM input based on the determination that the PWM input is shorter than the runt signal limit; and
  output the adjusted PWM signal to an electronic device; and
a counter to begin a determination of a length of the first pulse of the PWM input after a prescribed delay between the PWM input and the output of the adjusted PWM signal.

2. An apparatus, comprising:
an adjustment circuit to:
  receive a pulsed-width modulation (PWM) input, the PWM input to include a PWML signal and a PWMH signal;
  generate an adjusted PWM signal based upon the PWM input, the adjusted PWM signal to include an adjusted PWML signal and an adjusted PWMH signal, the PWMH signal and the PWML signal to include PWM signals and to be complements of each other during a plurality of clock cycles, the adjusted PWMH signal and the adjusted PWML signal to include PWM signals and to be complements of each other during a plurality of clock cycles;
  determine that a first pulse of the PWM input is shorter than a runt signal limit;
  in the adjusted PWM signal, extend the first pulse of the PWM input based on the determination that the PWM input is shorter than the runt signal limit;
  selectively adjust the PWMH signal to generate the adjusted PWMH signal and selectively adjust the PWML signal to generate the adjusted PWML signal; and
  output the adjusted PWM signal to an electronic device; and
a counter to:
  continuously determine lengths of respective pulses of the PWMH signal or the PWML signal; and
  begin determination of a length of a respective pulse of one the PWMH signal or the PWML signal after a changed edge on the PWMH signal or the PWML signal and after a changed edge on the adjusted PWMH signal or on the adjusted PWML signal since a last reset of the counter.

3. The apparatus of claim 2, wherein:
the first pulse and a second pulse are of the PWMH signal;
the adjustment circuit is further to, based upon extension of the first pulse, shorten the second pulse to generate the adjusted PWMH signal, the second pulse immediately following the first pulse;
the PWML signal includes a third pulse and a fourth pulse, the third pulse a complement of the first pulse, the fourth pulse a complement of the second pulse;
the adjustment circuit is to:

determine that the third pulse is a runt pulse;
extend the third pulse based upon the determination that third pulse is a runt pulse and, based upon extension of third pulse, shorten the fourth pulse to generate the adjusted PWML signal.

4. A method, comprising:
receiving a pulsed-width modulation (PWM) input;
generating an adjusted PWM signal based upon the PWM input;
determining that a first pulse of the PWM input is shorter than a runt signal limit;
with a counter, beginning a determination of a length of the first pulse of the PWM input after a prescribed delay between the PWM input and the output of the adjusted PWM signal;
in the adjusted PWM signal, extending the first pulse of the PWM input based on the determination that the PWM input is shorter than the runt signal limit; and
outputting the adjusted PWM signal to an electronic device.

5. A method, comprising:
receiving a pulsed-width modulation (PWM) input, the PWM input to include a PWML signal and a PWMH signal;
generating an adjusted PWM signal based upon the PWM input, the adjusted PWM signal to include an adjusted PWML signal and an adjusted PWMH signal, the PWMH signal and the PWML signal to include PWM signals and to be complements of each other during a plurality of clock cycles, the adjusted PWMH signal and the adjusted PWML signal to include PWM signals and to be complements of each other during a plurality of clock cycles;
determining that a first pulse of the PWM input is shorter than a runt signal limit;
in the adjusted PWM signal, extending the first pulse of the PWM input based on the determination that the PWM input is shorter than the runt signal limit;
selectively adjusting the PWMH signal to generate the adjusted PWMH signal and selectively adjust the PWML signal to generate the adjusted PWML signal;
with a counter:
continuously determining lengths of respective pulses of the PWMH signal; and
beginning determination of a length of a respective pulse of one the PWMH signal or the PWML signal after a changed edge on the PWMH signal or the PWML signal and after a changed edge on the adjusted PWMH signal or on the adjusted PWML signal since a last reset of the counter; and
outputting the adjusted PWM signal to an electronic device.

6. The method of claim 5, wherein:
the first pulse and a second pulse are of the PWMH signal;
the PWML signal includes a third pulse and a fourth pulse, the third pulse a complement of the first pulse, the fourth pulse a complement of the second pulse; and
the method includes:
based upon extension of the first pulse, shortening the second pulse to generate the adjusted PWMH signal, the second pulse immediately following the first pulse;
determining that the third pulse is a runt pulse; and
extending the third pulse based upon the determination that third pulse is a runt pulse and, based upon extension of third pulse, shortening the fourth pulse to generate the adjusted PWML signal.

7. A microcontroller, comprising:
a pulsed-width modulation (PWM) generation circuit to generate a PWM input;
an adjustment circuit to:
receive the PWM input;
generate an adjusted PWM signal based upon the PWM input;
determine that a first pulse of the PWM input is shorter than a runt signal limit;
in the adjusted PWM signal, extend the first pulse of the PWM input based on the determination that the PWM input is shorter than the runt signal limit; and
output the adjusted PWM signal to an electronic device; and
a counter to begin a determination of a length of the first pulse of the PWM input after a prescribed delay between the PWM input and the output of the adjusted PWM signal.

8. A microcontroller, comprising:
a pulsed-width modulation (PWM) generation circuit to generate a PWM input;
an adjustment circuit to:
receive the PWM input, the PWM input to include a PWML signal and a PWMH signal;
generate an adjusted PWM signal based upon the PWM input, the adjusted PWM signal to include an adjusted PWML signal and an adjusted PWMH signal, the PWMH signal and the PWML signal to include PWM signals and to be complements of each other during a plurality of clock cycles, the adjusted PWMH signal and the adjusted PWML signal to include PWM signals and to be complements of each other during a plurality of clock cycles;
determine that a first pulse of the PWM input is shorter than a runt signal limit;
in the adjusted PWM signal, extend the first pulse of the PWM input based on the determination that the PWM input is shorter than the runt signal limit;
selectively adjust the PWMH signal to generate the adjusted PWMH signal and selectively adjust the PWML signal to generate the adjusted PWML signal; and
output the adjusted PWM signal to an electronic device; and
a counter to:
continuously determine lengths of respective pulses of the PWMH signal or the PWML signal; and
begin determination of a length of a respective pulse of one the PWMH signal or the PWML signal after a changed edge on the PWMH signal or the PWML signal and after a changed edge on the adjusted PWMH signal or on the adjusted PWML signal since a last reset of the counter.

9. The microcontroller of claim 8, wherein:
the first pulse and a second pulse are of the PWMH signal;
the adjustment circuit is further to, based upon extension of the first pulse, shorten the second pulse to generate the adjusted PWMH signal, the second pulse immediately following the first pulse;
the PWML signal includes a third pulse and a fourth pulse, the third pulse a complement of the first pulse, the fourth pulse a complement of the second pulse;
the adjustment circuit is to:
determine that the third pulse is a runt pulse;
extend the third pulse based upon the determination that third pulse is a runt pulse and, based upon extension of third pulse, shorten the fourth pulse to generate the adjusted PWML signal.

* * * * *